(12) United States Patent
Park et al.

(10) Patent No.: US 12,048,235 B2
(45) Date of Patent: Jul. 23, 2024

(54) DISPLAY COMPONENT AND DISPLAY DEVICE HAVING A PROTECTIVE FILM DEFINING AN OPENING TO FACILITATE BENDING THEREOF

(71) Applicant: Samsung Display Co., Ltd., Yongin-si (KR)

(72) Inventors: Sungjune Park, Suwon-si (KR); ByeongKyu Park, Daejeon (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 17/850,147

(22) Filed: Jun. 27, 2022

(65) Prior Publication Data

US 2022/0328777 A1 Oct. 13, 2022

Related U.S. Application Data

(62) Division of application No. 16/808,838, filed on Mar. 4, 2020, now Pat. No. 11,398,608.

(30) Foreign Application Priority Data

May 7, 2019 (KR) ........................ 10-2019-0053052

(51) Int. Cl.
*H10K 77/10* (2023.01)
*B32B 7/12* (2006.01)
*B32B 27/28* (2006.01)
*H10K 59/12* (2023.01)
(Continued)

(52) U.S. Cl.
CPC .............. *H10K 77/111* (2023.02); *B32B 7/12* (2013.01); *B32B 27/281* (2013.01); *H10K 59/12* (2023.02); *H10K 71/00* (2023.02); *B32B 2457/20* (2013.01); *H10K 2102/311* (2023.02)

(58) Field of Classification Search
CPC ...... H10K 59/12; H10K 71/00; H10K 77/111; H10K 2102/311; B32B 7/12; B32B 27/281; B32B 2457/20
See application file for complete search history.

(56) References Cited

U.S. PATENT DOCUMENTS 9,493,680 B2 11/2016 Schümann et al.
10,985,332 B2 4/2021 Shin et al.
11,094,894 B2 * 8/2021 Xie ...................... H10K 77/111
(Continued)

FOREIGN PATENT DOCUMENTS

EP 3182474 A1 * 6/2017 ....... G02F 1/133305
EP 3217447 A1 * 9/2017 ............. G02F 1/133
(Continued)

*Primary Examiner* — Matthew E Warren
(74) *Attorney, Agent, or Firm* — CANTOR COLBURN LLP

(57) ABSTRACT

Provided is a method for manufacturing a display device. The method includes forming a display unit including a bending area on a first surface of a mother substrate, aligning a mask in which a mask opening is defined on a second surface of the mother substrate, plasma treating the second surface of the mother substrate, removing the mask and attaching a protective film to the second surface of the mother substrate, and removing a portion of the protective film to form a film opening corresponding to the bending area. The mask opening corresponds to the bending area.

11 Claims, 14 Drawing Sheets

(51) Int. Cl.
    *H10K 71/00*         (2023.01)
    *H10K 102/00*      (2023.01)

(56)            References Cited

U.S. PATENT DOCUMENTS

| | | |
|---|---|---|
| 2017/0038641 A1 | 2/2017 | Yamazaki |
| 2017/0092708 A1* | 3/2017 | Jeon ................... H10K 59/131 |
| 2017/0271616 A1* | 9/2017 | Choi ..................... H10K 50/87 |
| 2017/0323779 A1* | 11/2017 | Um ..................... H01L 27/1262 |
| 2018/0162095 A1 | 6/2018 | Lim et al. |
| 2018/0166652 A1 | 6/2018 | Kim et al. |
| 2018/0175324 A1* | 6/2018 | Fujioka ................. H10K 71/00 |
| 2019/0140196 A1* | 5/2019 | Ko ........................ H10K 77/10 |
| 2019/0319215 A1* | 10/2019 | Lee ...................... H10K 77/111 |
| 2019/0361285 A1 | 11/2019 | Wang et al. |
| 2020/0016868 A1 | 1/2020 | Woody, V et al. |
| 2020/0227677 A1 | 7/2020 | Park |
| 2020/0365627 A1* | 11/2020 | Zhang ................. H01L 27/1218 |
| 2021/0020873 A1 | 1/2021 | Hu et al. |

FOREIGN PATENT DOCUMENTS

| | | |
|---|---|---|
| KR | 1020140031302 A | 3/2014 |
| KR | 1020170125161 A | 11/2017 |
| KR | 1020180033375 A | 4/2018 |
| KR | 1020180066378 A | 6/2018 |
| KR | 1020180068382 A | 6/2018 |
| KR | 1020200087917 A | 7/2020 |

* cited by examiner

DISPLAY COMPONENT AND DISPLAY DEVICE HAVING A PROTECTIVE FILM DEFINING AN OPENING TO FACILITATE BENDING THEREOF

This application is a divisional of U.S. patent application Ser. No. 16/808,838, filed on Mar. 4, 2020, which claims priority to Korean Patent Application No. 10-2019-0053052, filed on May 7, 2019, and all the benefits accruing therefrom under 35 U.S.C. § 119, the contents of which in its entirety is herein incorporated by reference.

BACKGROUND

1. Field

The present disclosure herein relates to a display device.

2. Description of the Related Art

Various display devices used in multimedia devices such as televisions, mobile phones, tablet computers, navigation systems, and game consoles are being developed. These display devices include a display module disposed on a substrate. The substrate of the display device may be electrically connected to a circuit substrate which provides driving signals.

Pads and other components for electrically connecting to the circuit board are arranged in a non-display area of the substrate. When it is desired to dispose a display area on the entire one surface of the display device, the non-display area in which the pads and other components are arranged should be minimized.

Efforts for reducing the non-display area in the display device continues by bending a portion of the substrate.

SUMMARY

The present disclosure provides a display device in which a portion of a substrate may be bent and a method for manufacturing the same.

The present disclosure also provides a display component which may be applied to a display device in which a portion of a substrate may be bent.

An exemplary embodiment of the invention provides a method for manufacturing a display device. The method includes forming a display unit including a bending area on a first surface of a mother substrate, aligning a mask in which a mask opening is defined on a second surface of the mother substrate, plasma treating the second surface of the mother substrate, removing the mask and attaching a protective film to the second surface of the mother substrate, and removing a portion of the protective film to form a film opening corresponding to the bending area. The mask opening corresponds to the bending area.

In an exemplary embodiment, the protective film may include an adhesive layer and a protective film base, and the protective film base may be attached to the second surface of the mother substrate through the adhesive layer therebetween.

In an exemplary embodiment, the protective film base may include polyimide.

In an exemplary embodiment, the removing of the portion of the protective film may include irradiating the second surface of the mother substrate corresponding to the bending area with ultraviolet light.

In an exemplary embodiment, the plasma treating may include injecting the mother substrate into a reactor and performing a plasma treatment of the mother substrate during a predetermined processing time in the reactor.

In an exemplary embodiment, the display unit may further include a non-bending area adjacent to the bending area, and the processing time may be set such that a proportion of a silicon polymeric material on a portion of the second surface of the mother substrate corresponding to the bending area becomes greater than a proportion of a silicon polymeric material on another portion of the second surface of the mother substrate corresponding to the non-bending area.

In an exemplary embodiment, a rate at which the mother substrate passes through the reactor may be 100 millimeters per second (mm/s) or more.

In an exemplary embodiment, the forming of a display unit may include forming a plurality of display units disposed apart from each other on the first surface of the mother substrate, and each of the plurality of display units may include the bending area.

In an exemplary embodiment of the invention, a display device includes a substrate which includes a first surface, a second surface, a bending area, and a non-bending area, a display module which is disposed on the first surface of the substrate, and a protective film which is disposed on the second surface of the substrate and defines an opening corresponding to the bending area. Here, a proportion of a silicon polymeric material of the bending area is greater than a proportion of a silicon polymeric material of the non-bending area in the second surface.

In an exemplary embodiment, the protective film may include an adhesive layer and a protective film base, and the protective film base may be attached to the second surface of the substrate through the adhesive layer therebetween.

In an exemplary embodiment, the protective film base may include polyimide.

In an exemplary embodiment, the substrate may be bent with respect to a bending axis, and the non-bending area may include a first non-bending area and a second non-bending area.

In an exemplary embodiment, the bending area may be disposed between the first non-bending area and the second non-bending area.

In an exemplary embodiment, the display module may be disposed on the first non-bending area of the first surface of the substrate.

In an exemplary embodiment, the display device may further include a pad which is disposed on the substrate and electrically connected to the display module, and the pad may be disposed in the second non-bending area.

In an exemplary embodiment of the invention, a display component includes a mother substrate which includes a first surface and a second surface, a plurality of display units which is disposed on the first surface of the mother substrate, and a protective film which is disposed on the second surface of the mother substrate and includes a plurality of openings. The mother substrate includes a plurality of bending areas corresponding to the plurality of display units, respectively, and the plurality of openings of the protective film correspond to the plurality of bending areas, respectively.

In an exemplary embodiment, the protective film may include an adhesive layer and a protective film base, and the protective film base may be attached to the second surface of the mother substrate through the adhesive layer therebetween.

In an exemplary embodiment, the protective film base may include polyimide.

In an exemplary embodiment, the mother substrate may further include non-bending areas which correspond to the plurality of display units, respectively, and are adjacent to the plurality of bending areas, and each of the display units may be disposed in the corresponding non-bending area among the non-bending areas.

In an exemplary embodiment, a proportion of a silicon polymeric material of the bending area is greater than a proportion of a silicon polymeric material of the non-bending area in the second surface of the mother substrate.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

It will be understood that when an element (or region, layer, portion, etc.) is referred to as being "on", "connected to" or "coupled to" another element, it can be directly on, connected or coupled to the other element or layer or intervening elements may also be present.

Like numbers refer to like elements throughout. The thickness and the ratio and the dimension of the element are exaggerated for effective description of the technical contents.

The term "and/or" includes any and all combinations of one or more of the associated listed items.

The terms first and second may be used to describe various elements, however, the elements should not be limited by these terms. These terms are merely used for the purpose of discriminating one element from another element. For example, the first element may be designated as the second element, and similarly, the second element may also be designated as the first element, without departing from the spirit or scope of the invention. A singular form, otherwise indicated, include a plural form.

Further, the terms "under", "below", "on", "above", and the like, may be used herein for ease of description to describe one element or feature's relationship to another element(s) or feature(s) as illustrated in the figures. It will be understood that the terms are relative concept, and described on the basis of the direction illustrated in the figures.

Unless otherwise defined, all terms (including technical and scientific terms) used herein have the same meaning that is generally understood by a person skilled in the art. It will be further understood that the terms such as defined terms in commonly the dictionary should be considered to have the same meaning as the contextual meaning of the related art, and, unless understood abnormally or excessively formal meaning, should be expressly defined herein.

In the description, it should be understood that the term "comprise" or "have" intends to mean that there may be specified features, numerals, steps, operations, elements, parts, or combinations thereof, not excluding the possibility of the presence or addition of the specified features, numerals, steps, operations, elements, parts, or combinations thereof.

Hereinafter, exemplary embodiments of the invention will be described with reference to the drawings.

Figure 1:
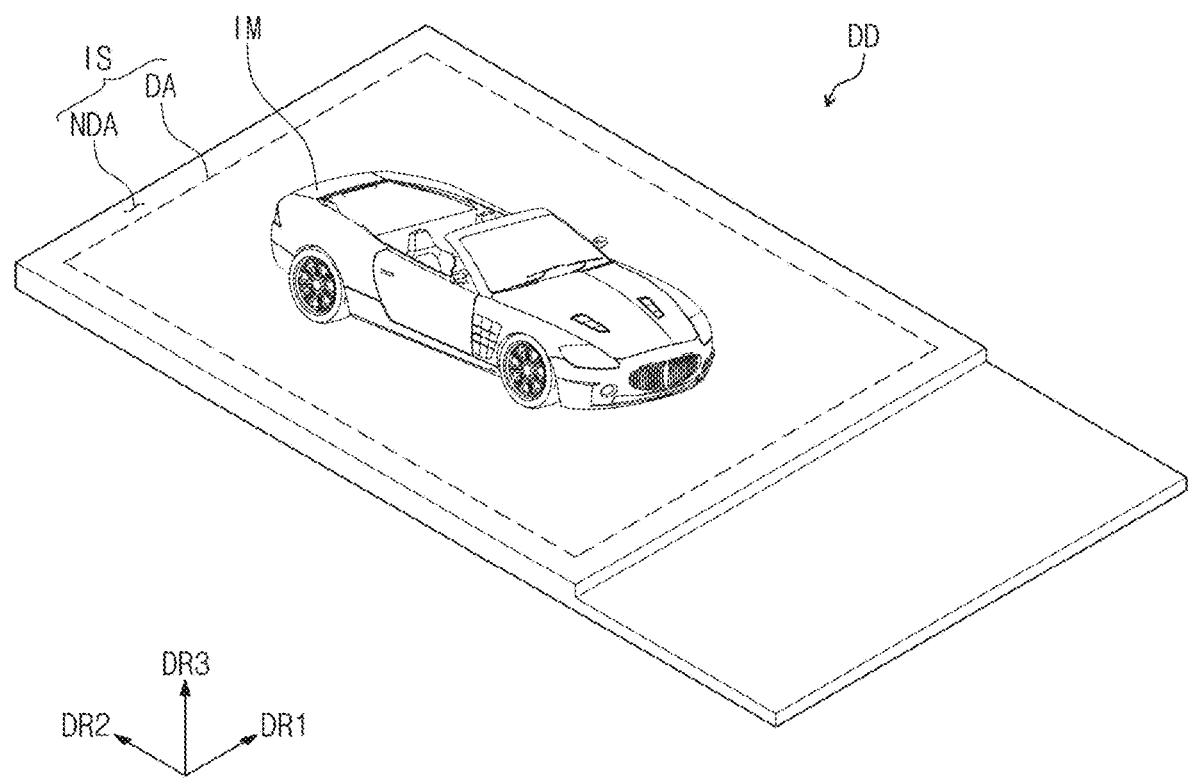
FIG. 1 is a perspective view of an exemplary embodiment of a display device according to the invention.

FIG. 1 is a perspective view of an exemplary embodiment of a display device DD according to the invention.

As illustrated in FIG. 1, a display surface IS on which an image IM is displayed is parallel to a plane defined by a first directional axis DR1 and a second directional axis DR2. A normal direction of the display surface IS, that is, a thickness direction of the display device DD, is indicated by a third directional axis DR3. A front surface (or upper surface) and a back surface (or lower surface) of each of members of the display device DD are distinguished by the third directional axis DR3. However, the directions indicated by the first to third directional axes DR1, DR2, and DR3 are relative concepts, and may be converted into different directions. Hereinafter, first to third directions refer to the same reference numerals in the directions indicated by the first to third directional axes DR1, DR2, and DR3, respectively.

Exemplary embodiments of the display device DD according to the invention may be large-sized electronic devices such as a television and a monitor, and also be medium and small-sized electronic devices such as a mobile phone, a tablet, a car navigation system, a game console, and a smart watch.

As illustrated in FIG. 1, the display device DD includes a display area DA for displaying the image IM and a non-display area NDA adjacent to the display area DA. The non-display area NDA is an area in which an image is not displayed. As an example, the display area DA may have a rectangular shape. The non-display area NDA may surround the display area DA. However, the invention is not limited thereto. In another exemplary embodiment, the shape of the display area DA and the shape of the non-display area NDA may be relatively designed.

Figure 2:
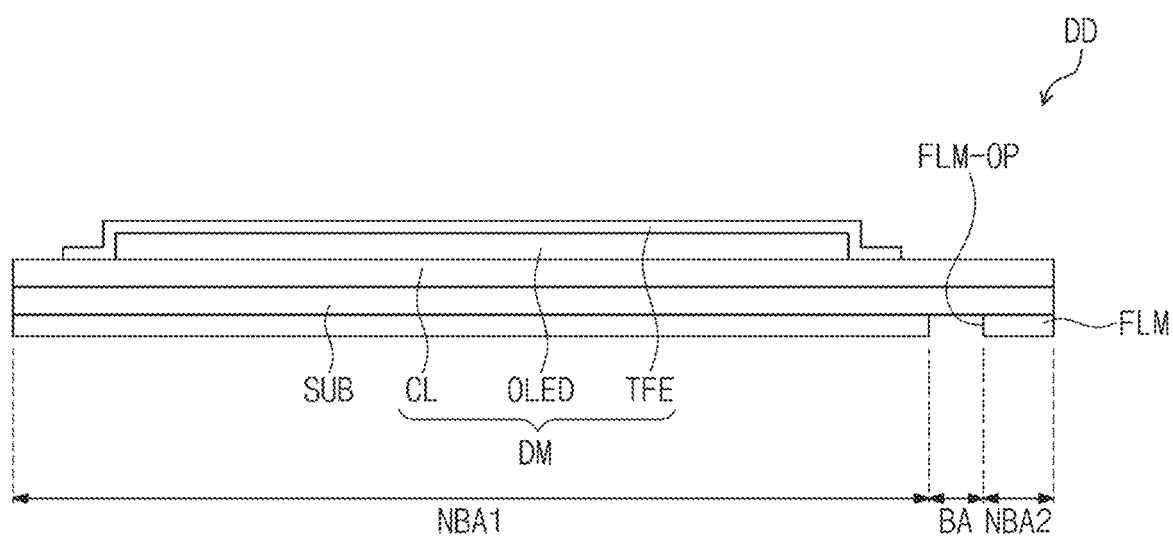
FIG. 2 is a cross-sectional view an exemplary embodiment of a display device according to the invention.
Figure 2:
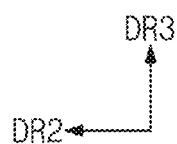

FIG. 2 is a cross-sectional view of an exemplary embodiment of a display device DD according to the invention. FIG. 2 illustrates a cross-section defined by the second directional axis DR2 and the third directional axis DR3.

As illustrated in FIG. 2, the display device DD includes a substrate SUB and a display module DM. The display device DD according to an exemplary embodiment of the invention further includes a protective film FLM disposed on a lower surface of the substrate SUB. Although not separately illustrated, the display device DD may further include an anti-reflective member and/or a window member disposed on an upper surface of the display module DM. In another exemplary embodiment, the display device DD may further include a touch sensing unit for sensing a user's touch input and between the upper surface of the display module DM and the window member (not illustrated).

The display module DM may be a luminescence display panel, and is not particularly limited thereto. For example, the display module DM may be an organic luminescence display panel or a quantum dot luminescence display panel. In the organic luminescence display panel, an emission layer includes an organic luminescence material. In the quantum dot luminescence display panel, an emission layer includes a quantum dot and/or a quantum rod. Hereinafter, the display module DM will be described as an organic luminescence display panel.

The substrate SUB may include at least one plastic film. The substrate SUB may be a flexible substrate, and may include a plastic substrate, a glass substrate, a metal substrate, or an organic/inorganic composite material substrate. The display area DA and the non-display area NDA described with reference to FIG. 1 may be equally defined on the substrate SUB.

In addition, the substrate SUB may include at least one non-bending area and a bending area BA. In an exemplary embodiment, the substrate SUB includes two non-bending areas, that is, a first non-bending area NBA1 and a second non-bending area NBA2, but the invention is not limited thereto.

The first non-bending area NBA1 and the second non-bending area NBA2 are disposed apart from each other along the second directional axis DR2, and the bending area BA is disposed between the first non-bending area NBA1 and the second non-bending area NBA2.

The display module DM includes a circuit element layer CL, a light emitting element OLED, and a thin film encapsulation layer TFE which are disposed on the substrate SUB. Although not separately illustrated, the display module DM may further include functional layers such as an antireflective layer and a refractive index control layer.

The circuit element layer CL includes at least one intermediate insulating layer and a circuit element. The intermediate insulating layer includes at least one intermediate inorganic film and at least one intermediate organic film. The circuit element includes signal lines, driving circuits of pixels, etc. A detailed description thereof will be described later.

The light emitting element OLED includes at least organic luminescence diodes. The light emitting element OLED may further include an organic film such as a pixel defining film.

The thin film encapsulation layer TFE seals the light emitting element OLED. The thin film encapsulation layer TFE includes at least one inorganic film (hereinafter, referred to as encapsulation inorganic film). The thin film encapsulation layer TFE may further include at least one organic film (hereinafter, referred to as encapsulation organic film). The encapsulation inorganic film protects the light emitting element OLED from moisture/oxygen, and the encapsulation organic film protects the light emitting element OLED from foreign substances such as dust particles. The encapsulation inorganic film may include a silicon nitride layer, a silicon oxynitride layer and a silicon oxide layer, a titanium oxide layer, or an aluminum oxide layer. The encapsulation organic film may include an acrylic-based organic layer, but the present invention is not limited to.

The protective film FLM is attached to the lower surface of the substrate SUB. The protective film FLM serves to prevent foreign substances such as air and water from permeating through the light emitting element OLED from the outside and protect the same from external impact. The protective film FLM defines a film opening FLM-OP corresponding to the bending area BA. In an exemplary embodiment, the film opening FLM-OP may have a length substantially equal to the bending area BA in the second directional axis DR2, but the invention is not limited thereto. That is, the length of the film opening FLM-OP in the second directional axis DR2 may be longer or shorter than the bending area BA. The protective film FLM and the film opening FLM-OP will be described later in detail.

Figure 3:
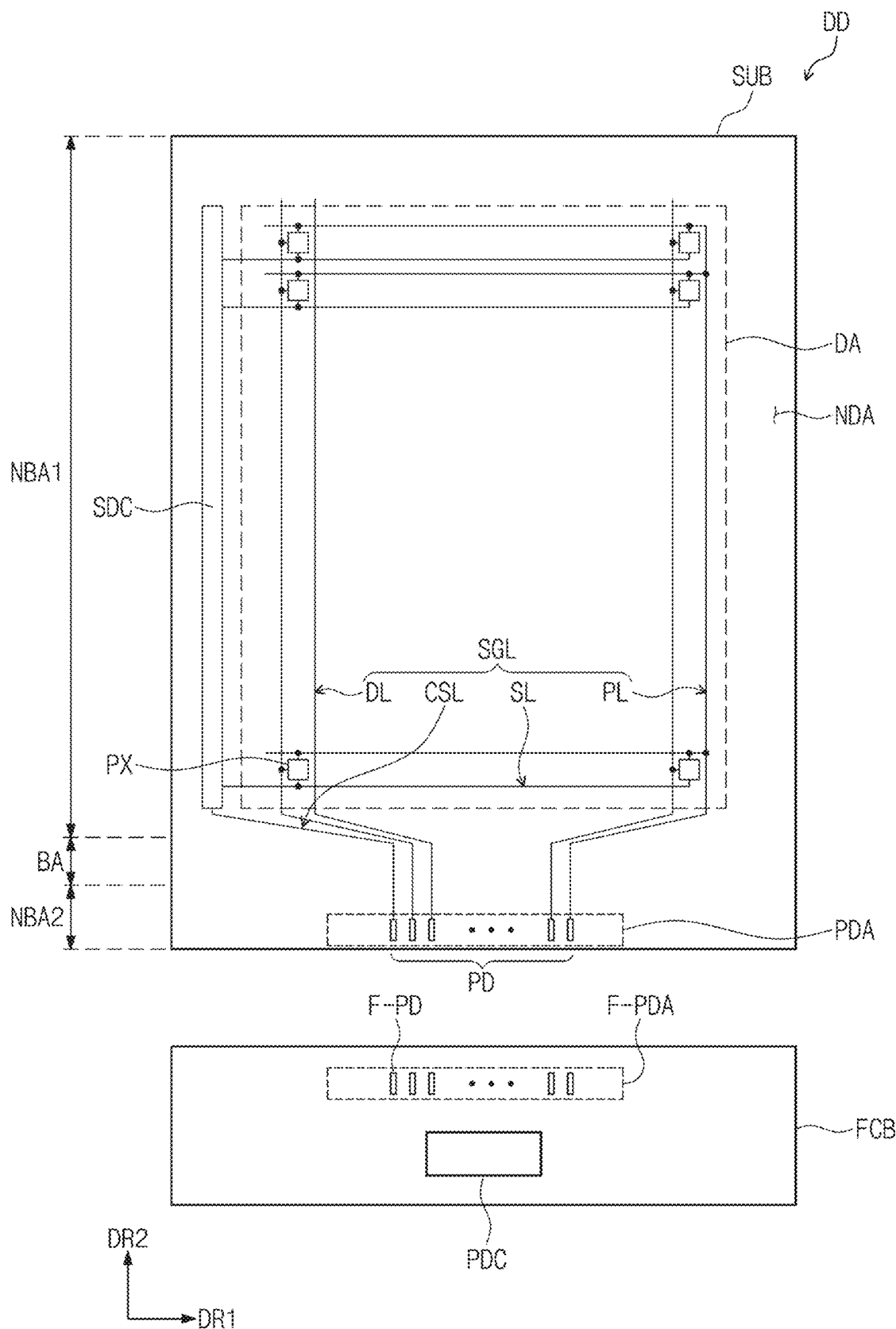
FIG. 3 is a plan view of an exemplary embodiment of a display unit according to the invention.

FIG. 3 is a plan view of an exemplary embodiment of a display unit according to the invention. In addition, for ease of description, in FIG. 3 some components of the display unit are omitted.

As illustrated in FIG. 3, the display device DD includes a display area DA and a non-display area NDA on the same plane. In the exemplary embodiment, the non-display area NDA may be defined along a rim of the display area DA at the outskirts of the display area DA.

The display device DD may include a scan driving circuit SDC, a plurality of signal lines SGL (hereinafter referred to as signal lines), a plurality of data pads PD, and a plurality of pixels PX (hereinafter referred to as pixels) disposed on a substrate SUB. The pixels PX are disposed in the display area DA. Each of the pixels PX includes an organic luminescence diode and a pixel driving circuit connected thereto.

The scan driving circuit SDC may include a scan driving circuit. The scan driving circuit generates a plurality of scan signals (hereinafter referred to as scan signals) and sequentially outputs the scan signals to a plurality of scan lines SL (hereinafter referred to as scan lines) which will be described later. The scan driving circuit may further output another control signal to a driving circuit of pixels PX.

The scan driving circuit SDC may include a plurality of thin film transistors formed through the same process as the driving circuit of pixels PX, for example, a low temperature polycrystalline silicon ("LTPS") process or a low temperature polycrystalline oxide ("LTPO") process.

The signal lines SGL include scan lines SL, data lines DL, a power supply line PL, and a control signal line CSL. The scan lines SL are connected to the corresponding pixels PX, respectively, and the data lines DL are connected to the corresponding pixels PX, respectively. The power supply line PL is connected to the pixels PX. The control signal line CSL may provide control signals to the scan driving circuit SDC.

The signal lines SGL overlap the display area DA and the non-display area NDA. The signal lines SGL may include a pad portion and a line portion. The line portion overlaps the display area DA and the non-display area DP. The pad portion is connected to the end of the line portion. The pad portion is disposed in the non-display area NDA and overlaps the corresponding data pads PD. An area in which the data pads PD are disposed in the non-display area NDA may be defined as a pad area PDA.

The line portion connected to the pixel PX substantially constitutes most of the signal lines SGL. The line portion is connected to transistors (not illustrated) of the pixel PX. The line portion may have a single layer/multilayer structure, and the line portion may be a single body or may include two or more parts. The two or more parts may be disposed on different layers and may be connected to each other through a contact hole which passes through an insulating layer disposed between the two or more parts.

The substrate SUB may include at least one non-bending area and bending area BA. In the exemplary embodiment illustrated in FIG. 3, the substrate SUB includes two non-bending areas, that is, a first non-bending area NBA1 and a second non-bending area NBA2, but the invention is not limited thereto.

The first non-bending area NBA1 and the second non-bending area NBA2 are disposed apart from each other in the second directional axis DR2, and the bending area BA is disposed between the first non-bending area NBA1 and the second non-bending area NBA2.

The first non-bending area NBA1 includes the display area DA and the second non-bending area NBA2 includes the pad area PDA. In an exemplary embodiment, a length of the first non-bending area NBA1 along the second directional axis DR2 is longer than a length of the display area DA in the same direction, and a length of the second non-bending area NBA2 along the second directional axis DR2 is longer than a length of the pad area PDA in the same direction. However, the invention is not limited thereto.

FIG. 3 additionally illustrates a printed circuit board FCB electrically connected to the display device DD. The printed circuit board FCB may be a rigid circuit board or a flexible circuit board. The printed circuit board FCB may be directly connected to the display device DD or may be connected to the display device DD through another circuit board.

A panel drive circuit PDC for controlling operation of the display device DD may be disposed on the printed circuit board FCB. Although not illustrated in the drawing, a plurality of passive elements may be further disposed on the printed circuit board FCB. The panel drive circuit PDC may be mounted on the printed circuit board FCB in a form of an integrated chip. The printed circuit board FCB may include board pads F-PD electrically connected to the data pads PD of the display device DD. The board pads F-PD may be disposed in a board pad area F-PDA. The printed circuit board FCB further includes signal lines connecting the board pads F-PD and the panel drive circuit PDC.

Figure 4:
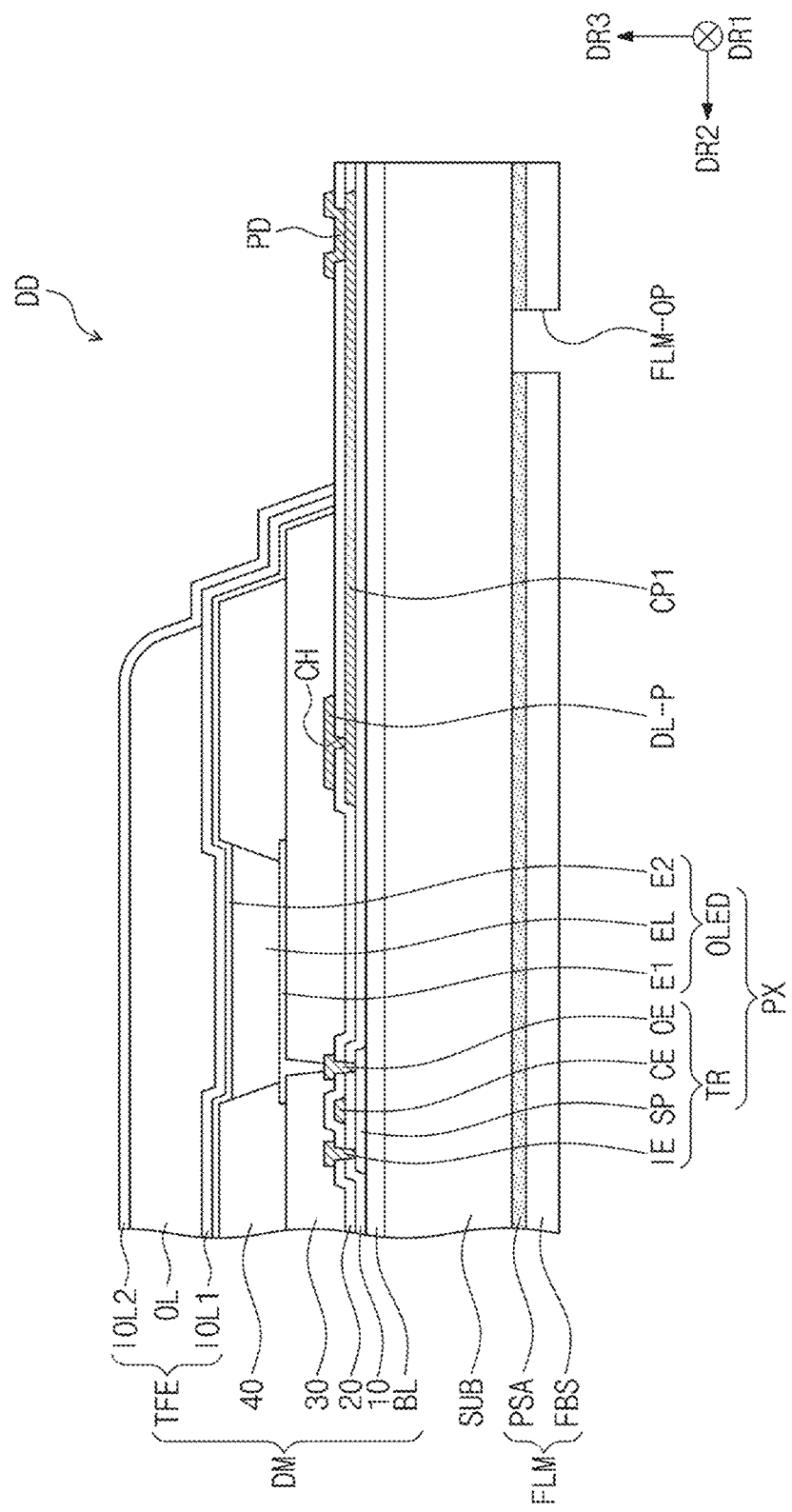
FIG. 4 illustrates a partial cross-sectional view of an exemplary embodiment of a display device corresponding to one pixel and one pad illustrated in FIG. 3.

FIG. 4 illustrates a partial cross-sectional view of an exemplary embodiment of a display device corresponding to one pixel and one pad illustrated in FIG. 3.

Referring to FIGS. 3 and 4, the substrate SUB may be an insulating substrate. For example, the substrate SUB may include a plastic substrate or a glass substrate. An auxiliary layer BL is disposed on the substrate SUB and covers the entire surface of the substrate SUB. The auxiliary layer BL includes an inorganic material. The auxiliary layer BL may include a barrier layer and/or a buffer layer. Accordingly, the auxiliary layer BL may prevent oxygen or moisture entering through the substrate SUB from permeating the pixel PX. In addition, the auxiliary layer BL improves a binding force between the substrate SUB and conductive patterns or semiconductor patterns.

The pixel PX may be disposed in the display area DA. In the exemplary embodiment, it is exemplarily illustrated and described that the pixel PX includes one transistor TR and light emitting element OLED, but the invention is not limited thereto. In another exemplary embodiment, for example, one pixel PX may include two or more transistors. Each of first to fourth insulating layers 10, 20, 30, and 40 may include an organic material and/or an inorganic material, and may have a single layer or a laminated structure.

The transistor TR is disposed on the substrate SUB, and may include a control electrode CE, an input electrode IE, an output electrode OE, and a semiconductor pattern SP. The control electrode CE is disposed apart from the semiconductor pattern SP with the first insulating layer 10 therebetween, and connected to one electrode of a capacitor. Each of the input electrode IE and output electrode OE is disposed on the second insulating layer 20, and connected to the semiconductor pattern SP by passing through the first insulating layer 10 and second insulating layer 20. The input electrode IE is connected to another electrode of the capacitor, and the output electrode OE is connected to the light emitting element OLED.

The light emitting element OLED includes a first electrode E1, an emission layer EL, and a second electrode E2. The first electrode E1 is disposed on the third insulating layer 30, and connected to the transistor TR by passing through the third insulating layer 30. The emission layer EL covers the first electrode E1 exposed by the fourth insulating layer 40. The emission layer EL may include a luminescence material which generates light corresponding to a potential difference. For example, the emission layer EL may include an organic luminescence material or a quantum dot.

The second electrode E2 is disposed on the emission layer EL. The second electrode E2 may be disposed on the entire surface of the display area DA. The second electrode E2 may extend from the display area DA to the non-display area NDA, and be connected to a connection pattern. The connection pattern may correspond to a power supply terminal.

The light emitting element OLED, controlled by the transistor TR, generates and emits light corresponding to a potential difference between a data signal supplied to the first electrode E1 and a power supply voltage (e.g., a ground voltage) supplied to the second electrode E2.

A first conductive pattern CP1 connects the data line DL and the data pad PD. The first conductive patterns CP1 may include a plurality of line patterns each extending along the second direction DR2 and disposed apart from each other along the first direction DR1.

In the exemplary embodiment, the first conductive pattern CP1 may be disposed in a different layer from the data lines DL. For example, the first conductive pattern CP1 may be disposed in the same layer as the control electrode CE, that is, scan line SL. At this time, a data line connection end DL-P extending from the data lines DL may be connected to the first conductive pattern CP1 through a contact hole CH which is defined in the second insulating layer 20. The first conductive pattern CP1 is disposed between the first insulating layer 10 and second insulating layer 20.

However, the exemplary embodiment above is exemplarily illustrated. In another exemplary embodiment, the first conductive pattern CP1 may be disposed in the same layer as the data lines DL. For example, the first conductive pattern CP1 may be integrally formed with the data lines DL and provided as a portion of the data lines DL, or may be connected to each of the data lines DL through a separate bridge pattern, etc. The first conductive pattern CP1 according to an exemplary embodiment of the invention may be provided in various forms as long as it may be connected to the data lines DL, and the invention is not limited to any one exemplary embodiment.

The encapsulation layer TFE is disposed on the fourth insulating layer 40 to seal the light emitting element OLED. The encapsulation layer TFE may include a first inorganic film IOL1, an organic film OL, and a second inorganic film IOL2 which are sequentially laminated along the third direction DR3. However, the exemplary embodiment above is exemplarily illustrated. In another exemplary embodiment, the encapsulation layer TFE may further include an inorganic film and an organic film, and at least one of the first inorganic film IOL1, the organic film OL, and the second inorganic film IOL2 may be omitted. In an exemplary embodiment, the organic film OL may extend to an area in which the scan driving circuit SDC is disposed.

The data pad PD is connected to the first conductive pattern CP1. In an exemplary embodiment, the data pad PD may be a data pad for transferring a data signal provided from the printed circuit board FCB to the data line DL.

In an exemplary embodiment, the data pad PD may be disposed in a different layer from the first conductive pattern CP1. For example, the data pad PD may be disposed on the second insulating layer 20, and connected to the first conductive pattern CP1 by passing through the second insulating layer 20. However, the exemplary embodiment above is exemplarily illustrated. In another exemplary embodiment, the data pad PD may be disposed in the same layer as the first conductive pattern CP1, or may be integrally formed with the first conductive pattern CP1.

The display device DD further includes a protective film FLM disposed on a lower surface of the substrate SUB. The protective film FLM includes an adhesive layer PSA and a protective film base FBS. The protective film base FBS may be attached to a lower surface of the substrate SUB by the adhesive layer PSA therebetween.

The protective film FLM defines a film opening FLM-OP corresponding to the bending area BA illustrated in FIG. 3. In an exemplary embodiment, the film opening FLM-OP may have a length substantially equal to the bending area BA along the second directional axis DR2, but the invention is not limited thereto.

Figure 5:
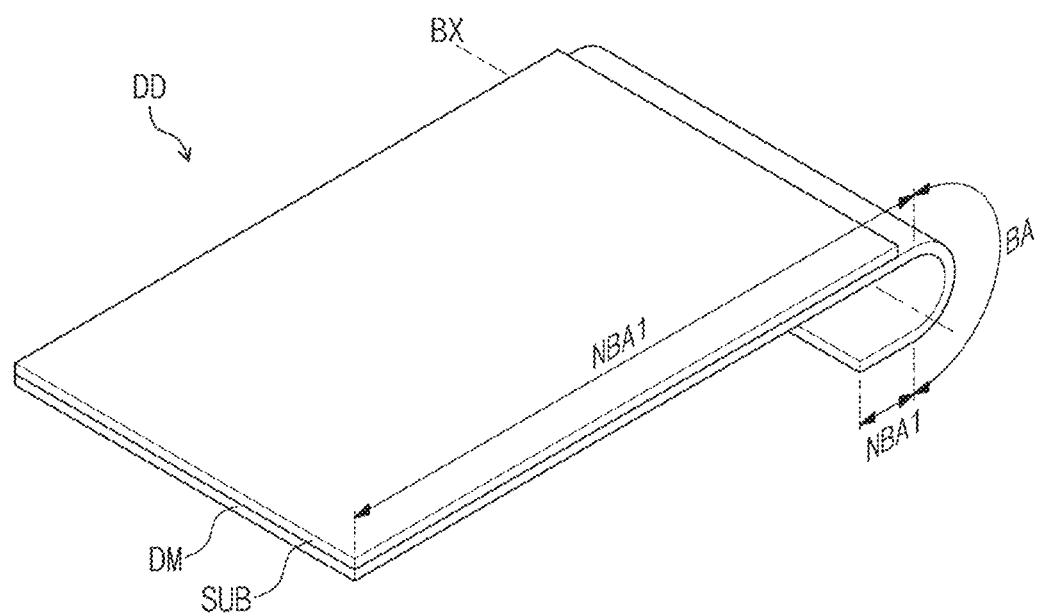
FIG. 5 is a perspective view schematically illustrating an exemplary embodiment of a portion of a display device according to the invention.
Figure 5:
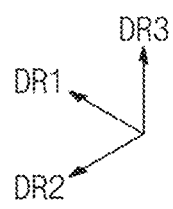

FIG. 5 is a perspective view schematically illustrating an exemplary embodiment of a portion of a display device according to the invention.

Referring to FIG. 5, a substrate SUB of the display device DD may be bent with respect to a bending axis BX. The substrate SUB may include various materials having flexible or bendable characteristics, such as polyethersulphone ("PES"), polyacrylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), or a polymer resin (e.g., cellulose acetate propionate ("CAP")).

A display module DM may be disposed on a first non-bending area NBA1 of the substrate SUB.

FIG. 6 and FIGS. 7A to 7E are views illustrating a process for forming a protective film.

Figure 6:
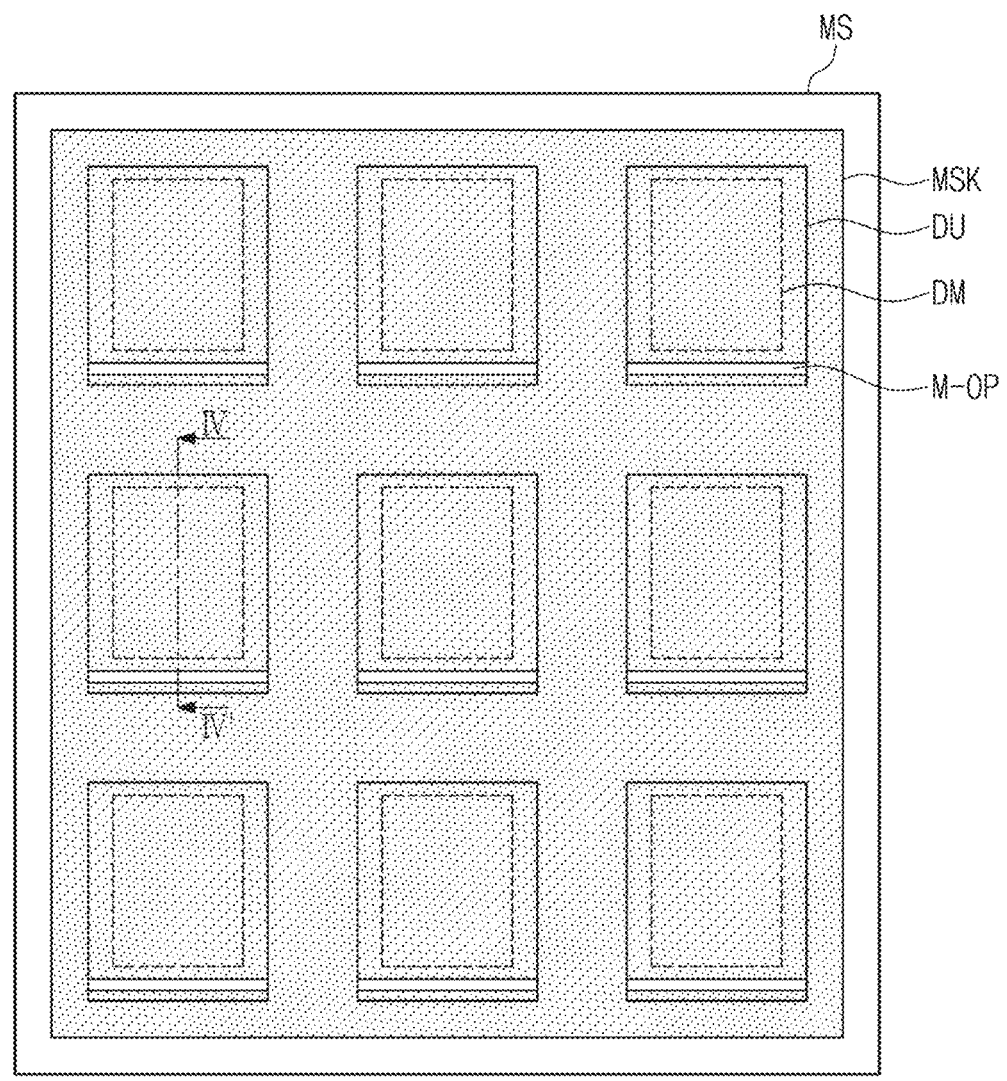
FIG. 6 is a view illustrating a mask disposed on a back surface of a mother substrate.
Figure 6:
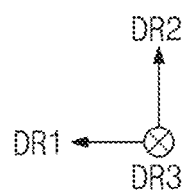

FIG. 6 is a view illustrating a mask disposed on a back surface of a mother substrate.

Referring to FIG. 6, the same producing process is applied to each of a plurality of display units DU set on the mother substrate MS to form the display module DM illustrated in FIG. 2. After the producing process is completed, the mother substrate MS is cut to separate the display units DU. The cut display unit DU may become the display device DD illustrated in FIG. 2.

In the mother substrate MS illustrated in FIG. 6, the display module DM is formed for each of the plurality of display units DU, and a protective film FLM is not attached.

Figure 7A:
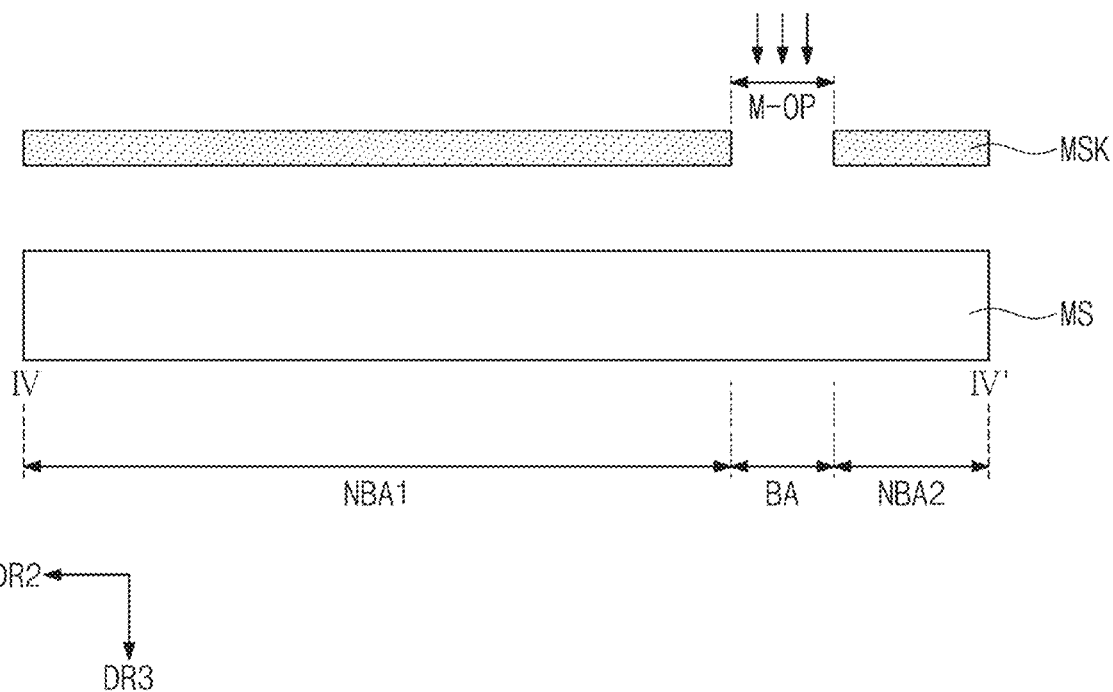
FIGS. 7A to 7E are views illustrating a process for forming a protective film.

As illustrated in FIGS. 6 and 7A, a mask MSK, in which a plurality of mask openings M-OP is defined, is aligned to the mother substrate MS. The mask opening M-OP may correspond to the bending area BA illustrated in FIGS. 2 and 3. The mother substrate MS, on which the mask MSK is aligned, is disposed in a plasma reactor, and then a plasma treatment is performed thereon.

A proportion of a polydimethylsiloxane ("PDMS") polymer on a surface of the mother substrate MS is changed by the plasma treatment.

Figure 7B:
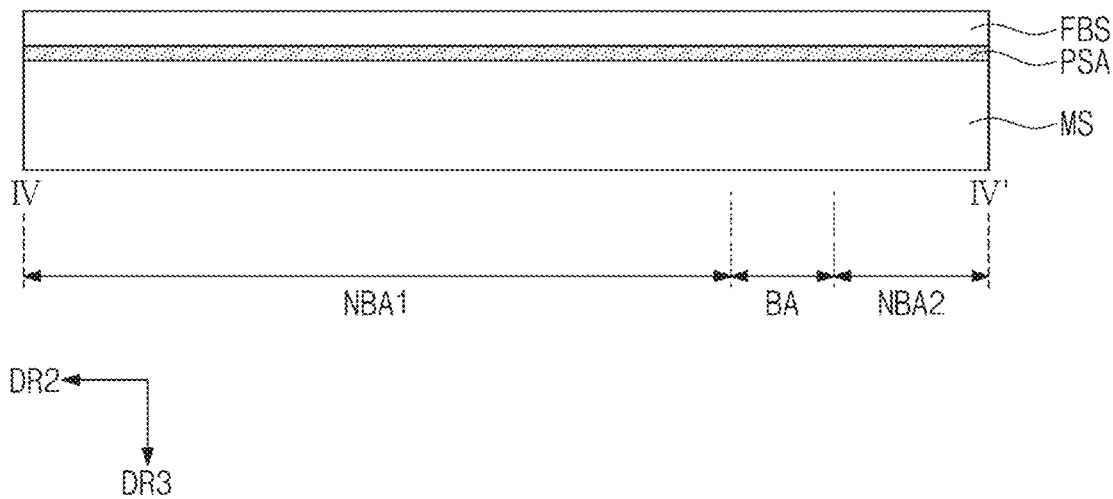

Referring to FIG. 7B, the mask MSK is removed. The proportion of the PDMS polymer in the plasma-treated bending area BA becomes greater than the proportion of the PDMS polymer in a first non-bending area NBA1 and a second non-bending area NBA2 overlapping the mask MSK illustrated in FIG. 7A.

A protective film base FBS, on which an adhesive layer PSA is laminated, is attached onto a lower surface of the plasma treated mother substrate MS. In an exemplary embodiment, the protective film base FBS may include various materials having flexible or bendable characteristics, for example, polyimide (PI).

Figure 7C:
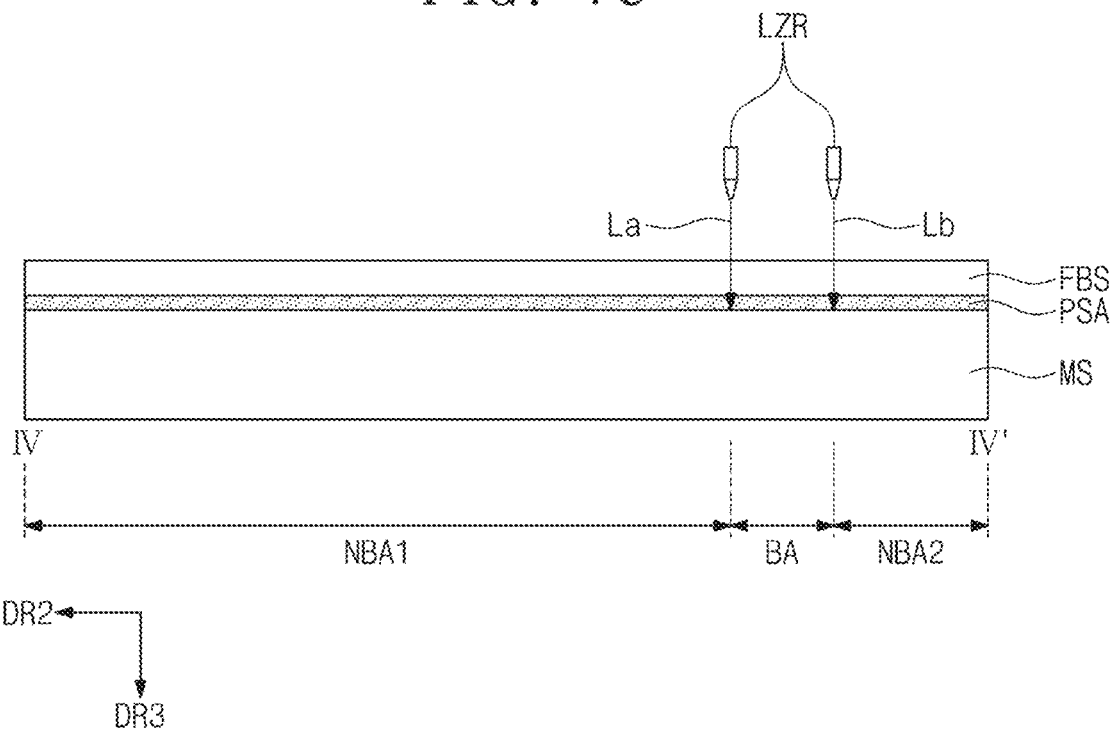

Referring to FIG. 7C, the bending area BA of the protective film base FBS is irradiated with a laser beam by using laser equipment LZR. The laser equipment LZR may be ultraviolet pico-second laser equipment. A first end of the bending area BA adjacent to the first non-bending area NBA1 of the protective film base FBS is cut by an ultraviolet light La. In addition, a second end of the bending area BA adjacent to the second non-bending area NBA2 of the protective film base FBS is cut by an ultraviolet light Lb.

Figure 7D:
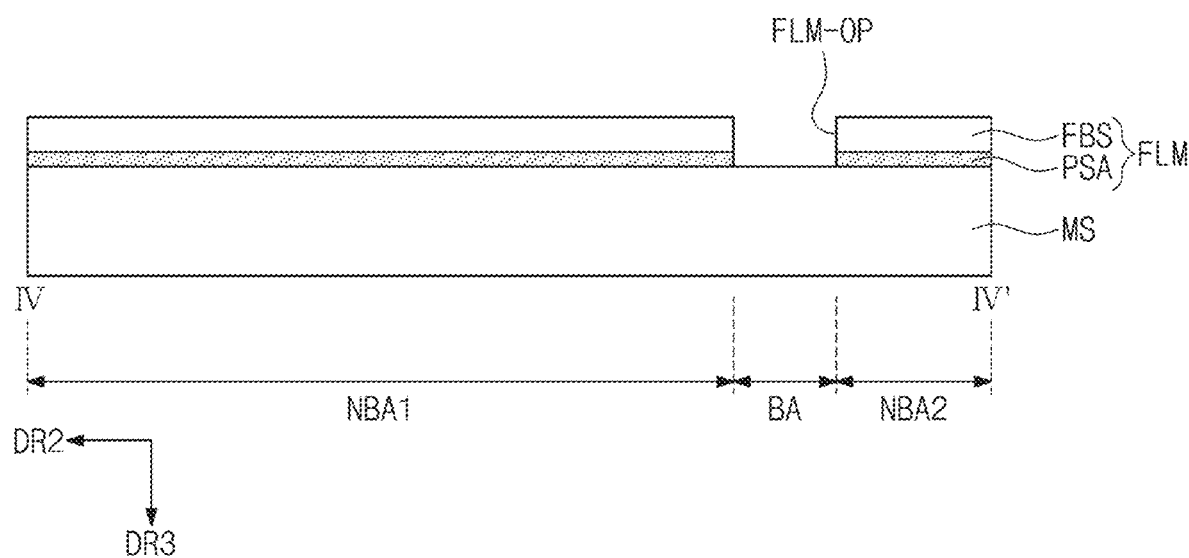

Referring to FIG. 7D, a film opening FLM-OP may be formed when the cut portion of the protective film base FBS is removed. The film opening FLM-OP corresponds to the bending area BA. In the bending area BA of the mother substrate MS in FIG. 7A above, the proportion of the PDMS polymer is increased by the plasma treatment, and accordingly, adhesion between the bending area BA of the mother substrate MS and the adhesive layer PSA is weakened. Therefore, it is easy to remove the cut portion of the protective film base FBS to define the film opening FLM-OP.

Figure 7E:
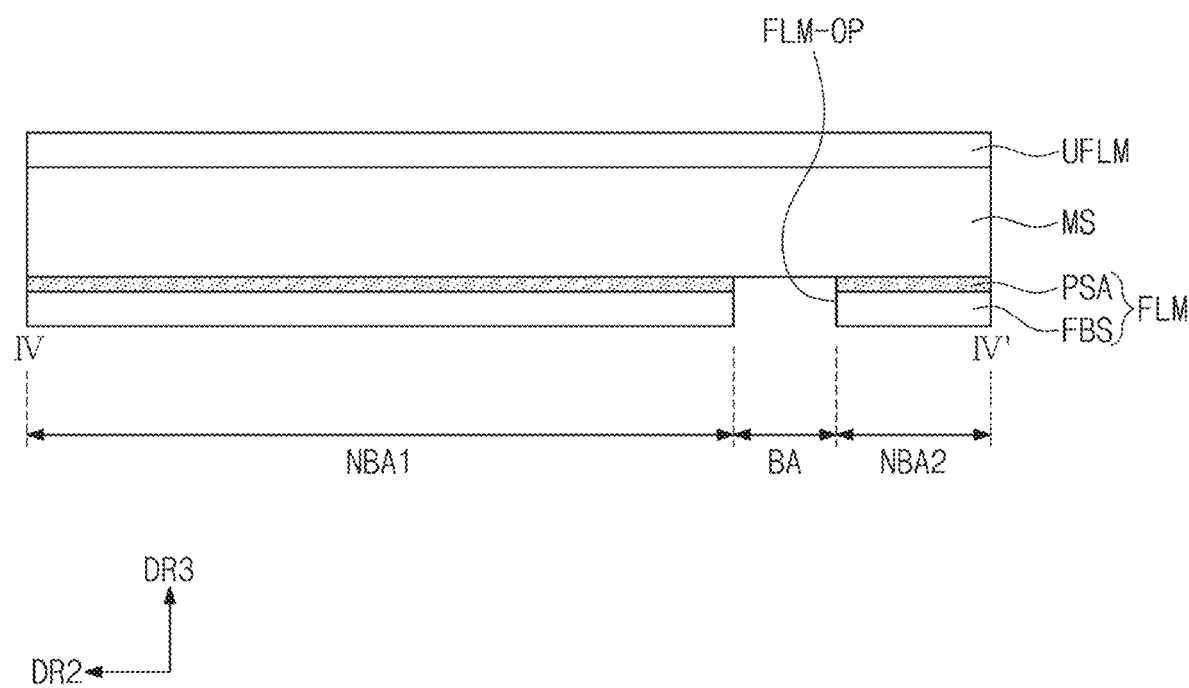

Referring to FIG. 7E, an upper protective film UFLM is attached to an upper portion of the mother substrate MS. Although not illustrated in the drawing, the upper protective film UFLM may include an adhesive layer.

In an exemplary embodiment, it is described that the protective film FLM is attached to the lower portion of the mother substrate MS, and then the upper protective film UFLM is attached, but the invention is not limited thereto. In another exemplary embodiment, the upper protective film UFLM may be first attached to the upper portion of the mother substrate MS, and then the protective film FLM may be attached to the lower portion of the mother substrate MS.

FIGS. 8A to 8F are exemplary views showing amount variations of silicon monomeric and polymeric materials in a plasma treated bending area.

Figure 8A:
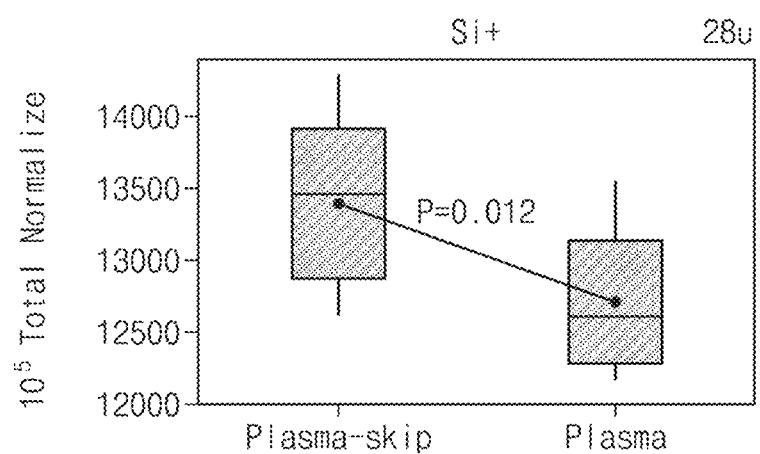
FIGS. 8A to 8F are exemplary views showing amount variations of silicon monomeric and polymeric materials in a plasma treated bending area.
Figure 8B:
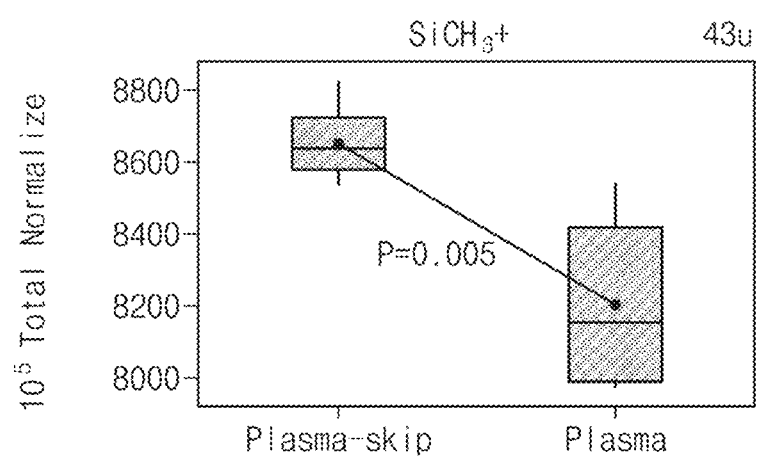
Figure 8C:
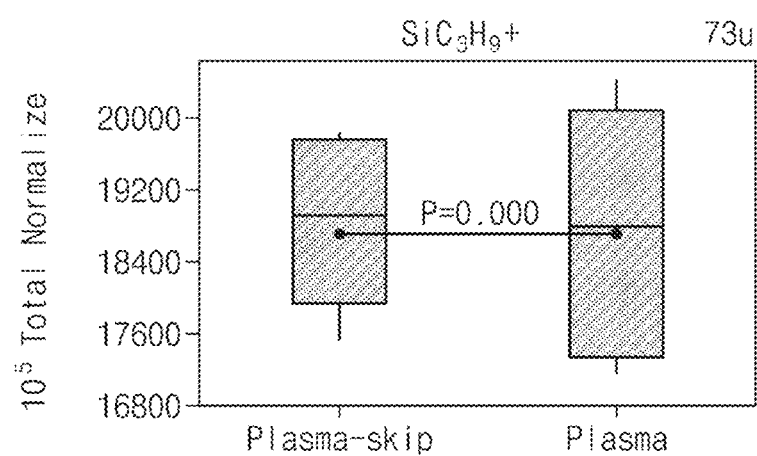

As shown in FIGS. 8A to 8C, after the plasma treatment, the amount of silicon monomeric materials (e.g., Si, $SiCH_3$, and $SiC_3H_9$) of the plasma treated bending area BA is reduced as compared with the amount of the silicon monomeric materials in the non-plasma treated non-bending areas NBA1 and NBA2 (See "Plasma-skip" in the figure).

Figure 8D:
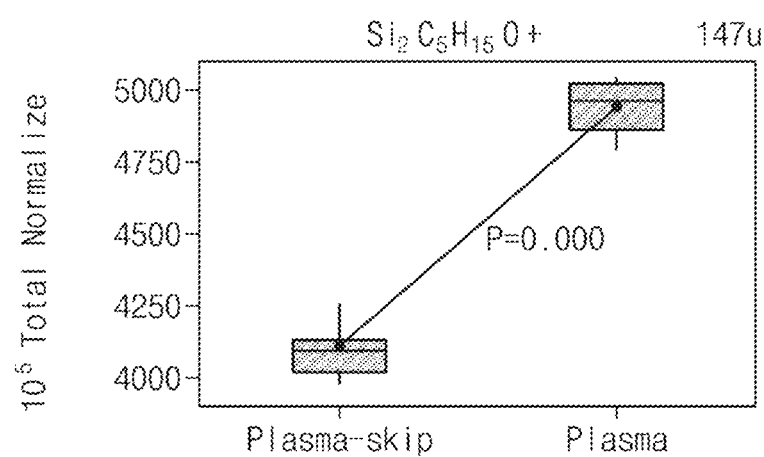
Figure 8E:
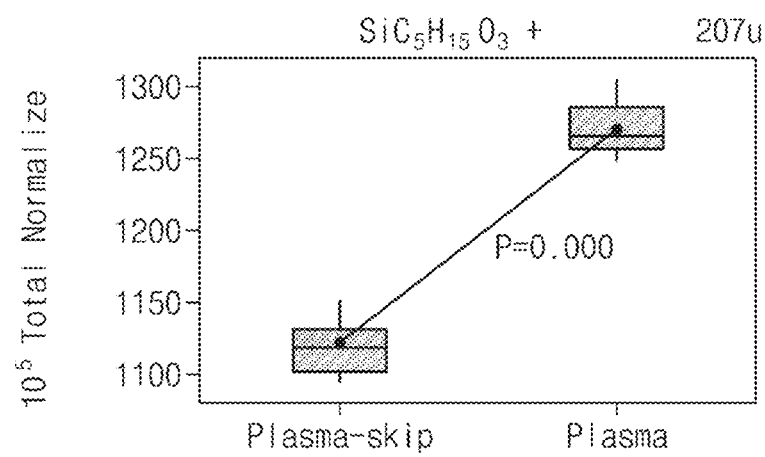
Figure 8F:
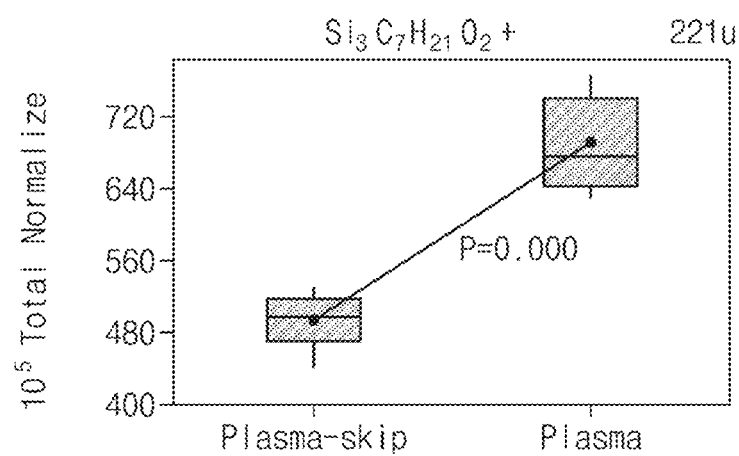

In contrast, as shown in FIGS. 8D to 8F, after the plasma treatment, the amount of silicon polymeric materials (e.g., $Si_2C_5H_{15}O$, $SiC_5H_{15}O_3$, and $Si_3C_7H_2O_2$) of the plasma treated bending area BA becomes greater the amount of the silicon polymeric materials in the non-plasma treated non-bending area NBA (See "Plasma-skip" in the figure). Particularly, a plasma treatment time for the bending area BA is controlled, whereby a proportion of a polydimethylsiloxane (PDMS) polymeric material is increased and the adhesion may be weakened.

Figure 9:
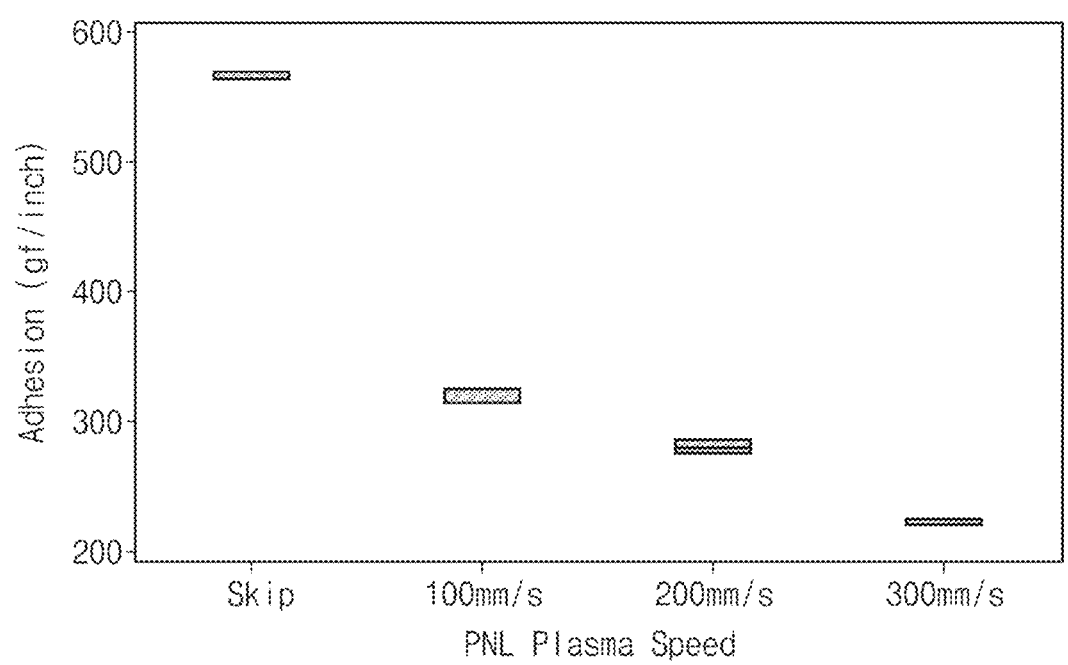
FIG. 9 is an exemplary view showing an adhesion variation of a bending area according to a plasma treatment time.

FIG. 9 is an exemplary view showing an adhesion variation of a bending area according to a plasma treatment time.

Referring to FIGS. 7A and 9, the mother substrate MS, on which a mask MSK is aligned, is disposed in a plasma reactor, and then the plasma treatment is performed while moving in the plasma reactor. The plasma treatment time for the mother substrate MS is inversely proportional to the moving speed of the mother substrate MS in the reactor. That is, as the moving speed of the mother substrate MS increases, the plasma treatment time decreases.

In the exemplary embodiment shown in FIG. 9, it could be confirmed that, compared to when the plasma treatment on the mother substrate MS is not performed ("Skip" in the figure), as the plasma treatment speed, that is, the moving speed of the mother substrate MS, increases, the adhesion in the bending area BA of the mother substrate MS decreases. For example, when the moving speed is 200 millimeters per second (mm/s), the adhesion decreases more than when the moving speed is 100 mm/s. Furthermore, when the moving speed is 300 mm/s, the adhesion decreases more than when the moving speed is 200 mm/s. Although not shown in the drawing, when the moving speed of the mother substrate MS is slower than 100 mm/s, an effect of decreasing the adhesion in the bending area BA of the mother substrate MS is not large, and therefore, the moving speed of the mother substrate MS is preferably 100 mm/s or more.

Figure 10:
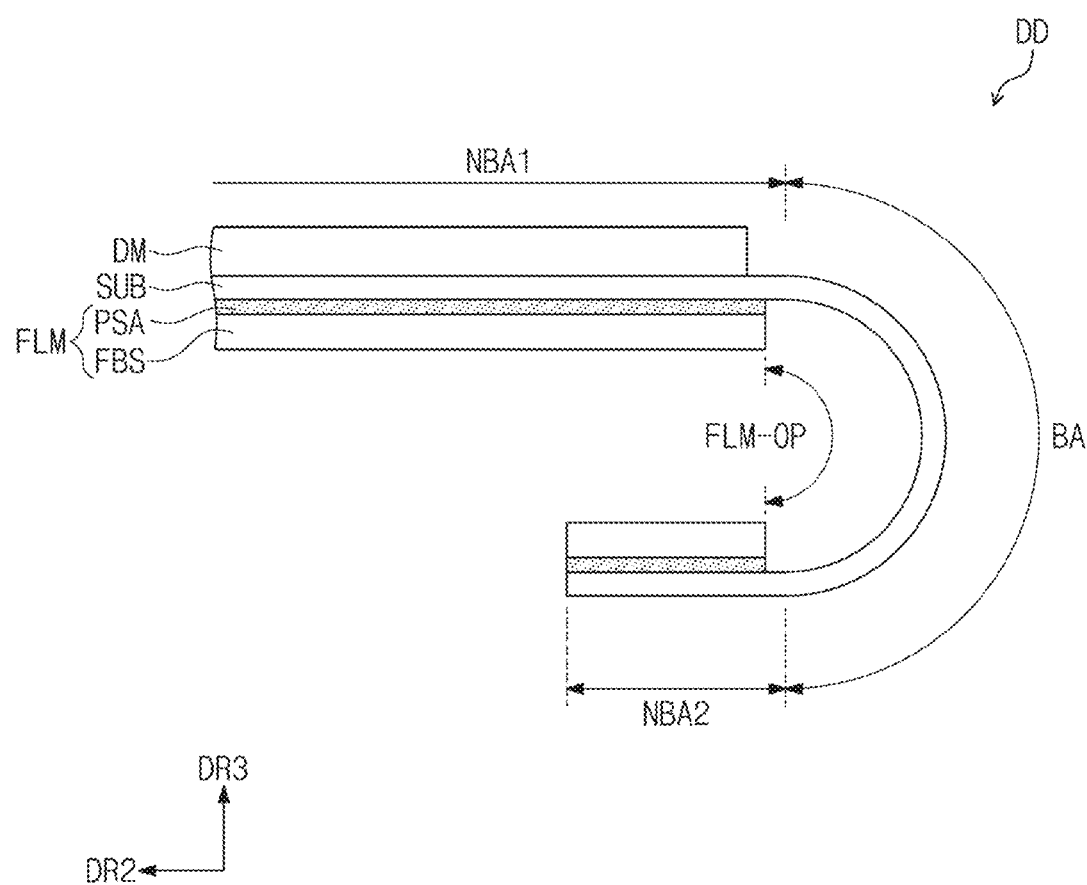
FIG. 10 is a cross-sectional view illustrating that an exemplary embodiment of a substrate of a display device is bent according to the invention.

FIG. 10 is a cross-sectional view illustrating that an exemplary embodiment of a substrate of a display device is bent according to the invention.

As illustrated in FIG. 10, the substrate SUB of the display device DD may be bent in a bending area BA.

A protective film base FBS of a protective film FLM serves to protect a lower surface of the substrate SUB, and accordingly may have rigidity itself, which makes flexibility of the protective film base FBS low. Accordingly, in a case that the protective film base FBS covers the bending area BA, when the substrate SUB is bent, peeling may occur between the protective film base FBS and the substrate SUB. In contrast, an exemplary embodiment of the protective film FLM of the display device DD according to the invention has an opening FLM-OP corresponding to the bending area BA to effectively prevent such peeling from occurring.

Furthermore, when a bending radius of the substrate SUB is small, the protective film base FBS may be composed of polyimide having flexible or bendable characteristics. According to an exemplary embodiment, peeling of the protective film base FBS composed of polyimide may be facilitated by plasma treating of the bending area BA of the mother substrate MS.

A display device having such a structure above may include a protective film under a substrate to protect a lower surface of the substrate. Furthermore, the protective film may define an opening corresponding to a bending area of the substrate to facilitate bending of the substrate.

Although the invention has been described with reference to preferred exemplary embodiments of the invention, it will be understood by those skilled in the art that various changes in form and details may be made therein without departing from the spirit and scope of the invention.

Accordingly, the technical scope of the invention is not intended to be limited to the contents set forth in the detailed description of the specification, but is intended to be defined by the appended claims.

What is claimed is:

1. A display device comprising:
a substrate which comprises a first surface, a second surface, a bending area, and a non-bending area;
a display module which is disposed on the first surface of the substrate; and
a protective film which is disposed on the second surface of the substrate and defines an opening corresponding to the bending area,
wherein the second surface of the substrate comprises a silicon polymeric material and a proportion of the silicon polymeric material in the bending area is greater than a proportion of the silicon polymeric material of in the non-bending area.

2. The display device of claim 1,
wherein the protective film comprises an adhesive layer and a protective film base, and
the protective film base is attached to the second surface of the substrate through the adhesive layer therebetween.

3. The display device of claim 2, wherein the protective film base comprises polyimide.

4. The display device of claim 2,
wherein the substrate is bent with respect to a bending axis, and
the non-bending area comprises a first non-bending area and a second non-bending area.

5. The display device of claim 4, wherein the bending area is disposed between the first non-bending area and the second non-bending area.

6. The display device of claim 4, wherein the display module is disposed on the first non-bending area of the first surface of the substrate.

7. The display device of claim 4, further comprising a pad which is disposed on the substrate and electrically connected to the display module,
wherein the pad is disposed in the second non-bending area.

8. A display component comprising:
a mother substrate which comprises a first surface, a second surface, a plurality of bending areas, and a plurality of non-bending areas;
a plurality of display units which is disposed on the first surface of the mother substrate corresponding to the plurality of bending areas; and
a protective film which is disposed on the second surface of the mother substrate and defines a plurality of openings,
the plurality of openings of the protective film corresponds to the plurality of bending areas, respectively, and
wherein the second surface of the mother substrate comprises a silicon polymeric material and a proportion of the silicon polymeric material in the plurality of bending areas is greater than a proportion of the silicon polymeric material in the plurality of non-bending areas.

9. The display component of claim 8,
wherein the protective film comprises an adhesive layer and a protective film base, and
the protective film base is attached to the second surface of the mother substrate through the adhesive layer therebetween.

10. The display component of claim 9, wherein the protective film base comprises polyimide.

11. The display component of claim 8,
wherein the non-bending areas which correspond to the plurality of display units, respectively, are adjacent to the plurality of bending areas, and
each of the display units is disposed in a corresponding non-bending area among the non-bending areas.

* * * * *